US006979252B1

(12) United States Patent
Siddiqui et al.

(10) Patent No.: US 6,979,252 B1
(45) Date of Patent: Dec. 27, 2005

(54) LOW DEFECTIVITY PRODUCT SLURRY FOR CMP AND ASSOCIATED PRODUCTION METHOD

(75) Inventors: Junaid Ahmed Siddiqui, Richmond, VA (US); Daniel Hernandez Castillo, II, Laveen, AZ (US); Rajat Kapoor, Morrisville, NC (US); Tara Ranae Keefover, Irvine, CA (US); Robin Edward Richards, Phoenix, AZ (US)

(73) Assignee: DuPont Air Products Nanomaterials LLC, Tempe, AZ (US)

( * ) Notice: Subject to any disclaimer, the term of this patent is extended or adjusted under 35 U.S.C. 154(b) by 0 days.

(21) Appl. No.: 11/030,503

(22) Filed: Jan. 6, 2005

Related U.S. Application Data (60) Provisional application No. 60/600,315, filed on Aug. 10, 2004.

(51) Int. Cl.$^7$ .............................................. B24B 1/00
(52) U.S. Cl. ...................... 451/60; 451/446; 210/749
(58) Field of Search .................... 451/60, 446; 216/88, 216/89; 106/3; 252/79.1; 210/749

(56) References Cited

U.S. PATENT DOCUMENTS

| | | | |
|---|---|---|---|
| 4,544,377 A | 10/1985 | Schwen | |
| 5,527,423 A | 6/1996 | Neville et al. | |
| 5,614,444 A | 3/1997 | Farkas et al. | |
| 5,885,334 A * | 3/1999 | Suzuki et al. | 106/3 |
| 6,063,306 A | 5/2000 | Kaufman et al. | |
| 6,238,279 B1 * | 5/2001 | Shau et al. | 451/446 |
| 6,261,476 B1 * | 7/2001 | Kwok et al. | 252/79.1 |
| 6,309,560 B1 | 10/2001 | Kaufman et al. | |
| 6,319,096 B1 | 11/2001 | Mueller et al. | |
| 6,338,744 B1 | 1/2002 | Tateyama et al. | |
| 6,340,374 B1 | 1/2002 | Kato et al. | |
| 6,343,976 B1 | 2/2002 | Yoshida et al. | |
| 6,409,936 B1 | 6/2002 | Robinson et al. | |
| 6,426,295 B1 | 7/2002 | Kramer et al. | |
| 6,458,289 B1 | 10/2002 | Merchant et al. | |
| 6,482,743 B1 | 11/2002 | Sato | |
| 6,503,418 B2 | 1/2003 | Sahota et al. | |
| 6,607,424 B1 | 8/2003 | Costas et al. | |
| 6,802,983 B2 * | 10/2004 | Mullee et al. | 210/749 |
| 2002/0005504 A1 | 1/2002 | Sahota et al. | |
| 2002/0034875 A1 | 3/2002 | Park et al. | |
| 2002/0177318 A1 | 11/2002 | Miller | |
| 2002/0182868 A1 | 12/2002 | Kramer et al. | |
| 2002/0185628 A1 | 12/2002 | Robinson et al. | |
| 2003/0094593 A1 | 5/2003 | Hellring et al. | |

(Continued)

FOREIGN PATENT DOCUMENTS

JP 11-116942 4/1999

(Continued)

OTHER PUBLICATIONS

Brian L. Mueller, et al, "Polishing Surfaces for Integrated Circuits," Chemtech, Feb. 1998, pp. 38-46.

(Continued)

*Primary Examiner*—George Nguyen
(74) *Attorney, Agent, or Firm*—Geoffrey L. Chase (57) ABSTRACT

A low defectivity colloidal silica-based product slurry for use in chemical mechanical planarization (CMP) and an associated production method are described. The product slurry is produced using centrifugation of and optionally with addition of a surfactant to a starting colloidal silica (which can be a commercially available colloidal silica). The product slurry has substantially lower levels of soluble polymeric silicates than does the starting colloidal silica and affords lower defectivity levels when used in a slurry for CMP processing than does the starting colloidal silica.

13 Claims, 2 Drawing Sheets

U.S. PATENT DOCUMENTS

2003/0228762 A1  12/2003  Moeggenborg et al.

FOREIGN PATENT DOCUMENTS

| JP | 2000-114212 | 4/2000 |
|---|---|---|
| JP | 2000-313815 | 11/2000 |
| JP | 2001-176825 | 6/2001 |
| JP | 2002097387 | 4/2002 |
| KR | 2000074300 | 12/2000 |
| WO | WO 02/051955 | 7/2002 |
| WO | WO 03/034804 | 5/2003 |

OTHER PUBLICATIONS

Howard Landis, "Integration of Chemical-Mechanical Polishing into . . . ," Thin Solid Films, 220, 1992, pp. 1-7.

Gregory B. Shinn, et al, "Chemical-Mechanical Polish," Handbook of Semiconductor Mfg. Technology, 2000, pp. 415-461.

R. K. Iler, "The Chemistry of Silica," John Wiley & Sons, NY, 1972, p. 42.

* cited by examiner

LOW DEFECTIVITY PRODUCT SLURRY FOR CMP AND ASSOCIATED PRODUCTION METHOD

This application claims the benefit of U.S. Provisional Application No. 60/600,315 filed Aug. 10, 2004.

BACKGROUND OF THE INVENTION

The present invention pertains to a colloidal silica-based composition that affords low defectivity levels when used as a component in chemical mechanical planarization (chemical mechanical polishing, CMP), and especially for oxide CMP.

Chemical mechanical planarization (chemical mechanical polishing, CMP) is now widely known to those skilled in the art and has been described in numerous patents and open literature publications. Some introductory references on CMP are as follows: "Polishing Surfaces for Integrated Circuits", by B. L. Mueller and J. S. Steckenrider, Chemtech, February, 1998, pages 38–46; and H. Landis et al., Thin Solids Films, 220 (1992), page 1.

In a typical CMP process, a substrate (e.g., a wafer) is placed in contact with a rotating polishing pad attached to a platen. A CMP slurry, typically an abrasive and chemically reactive mixture, is supplied to the pad during CMP processing of the substrate. During the CMP process, the pad (fixed to the platen) and substrate are rotated while a wafer carrier system or polishing head applies pressure (downward force) against the substrate. The slurry accomplishes the planarization (polishing) process by chemically and mechanically interacting with the substrate film being planarized due to the effect of the rotational movement of the pad relative to the substrate. Polishing is continued in this manner until the desired film on the substrate is removed with the usual objective being to effectively planarize the substrate (both metallic and dielectric portions).

In oxide CMP a slurry is used to planarize films comprised of oxide dielectric material (e.g., silicon dioxide). In shallow trench isolation (STI) CMP a slurry is used to planarize structures comprised of oxide dielectric material and silicon nitride. Furthermore, it is desired that the oxide CMP and STI CMP slurry compositions and associated methods afford planarized substrates characterized to have low defectivity levels, low haze levels, and low levels of scratching.

During oxide CMP and STI CMP, considerable amounts of particles are generated from the abraded substrate materials as debris during the planarization process. These particles, in addition to undersized abrasive particles present in the CMP slurry, are high energy and may adhere to the planarized wafer oxide layer as contaminant causing defects. The particles generated from the abraded substrate materials, in addition to oversized abrasive particles present in the CMP slurry, may cause undesirable scratching on the polished/planarized oxide surface. Therefore, it is desirable to prevent debris particles generated during polishing from the abraded substrate materials, from adhering too strongly to the planarized oxide surface.

Oxide CMP compositions comprise an abrasive(s), which is very often colloidal silica. Colloidal silica is an effective and preferred abrasive for use in CMP (e.g., oxide CMP) in most respects but most or all colloidal silicas known in the art do possess one significant drawback. This drawback is that use of colloidal silicas, when formulated into polishing compositions for CMP, can afford relatively high defectivity levels, especially during oxide CMP.

More specifically, colloidal silica dispersions are often used in oxide CMP formulations for planarizing oxide dielectrics during the fabrication of IC chips. CMP processors using colloidal silica often observe high defectivity while using colloidal silica in their oxide CMP process. After polishing an oxide wafer with a colloidal silica-based slurry, defects usually appear as scratches and/or micro-scratches on the wafer surface. The scratches and micro-scratches can be counted and otherwise characterized directly without pretreating the polished oxide surface using optical metrology test methods. In addition, in order to count and otherwise characterize micro-scratches, the polished oxide surface is typically first dipped in hydrofluoric acid solution before doing optical metrology. The high defectivity levels observed on polished wafers subsequent to oxide CMP with a colloidal silica-based slurry correspond to yield loss and are therefore undesirable.

There is a significant need in CMP processing for colloidal silicas that afford low defectivity levels when used as component(s) in CMP slurries. The present invention provides a solution to this significant need.

BRIEF SUMMARY OF THE INVENTION

In one embodiment, the invention is a method for separating and removing soluble polymeric silicates in a polishing slurry, said slurry comprising a colloidal dispersion of silica, prior to a chemical mechanical polishing process, the method comprising:
  a) introducing the polishing slurry into a centrifuge;
  b) separating via centrifugation the soluble polymeric silicates, as a portion, from the polishing slurry to yield a product slurry; and
  c) removing the product slurry from the centrifuge, wherein the product slurry has a lower level of soluble polymeric silicates than does the polishing slurry.

In another embodiment, the invention is a product slurry prepared according to a method for separating and removing soluble polymeric silicates in a polishing slurry, said slurry comprising a colloidal dispersion of silica, prior to a chemical mechanical polishing process, the method comprising:
  a) introducing the polishing slurry into a centrifuge;
  b) separating via centrifugation the soluble polymeric silicates from the polishing slurry to yield a product slurry; and
  c) removing the product slurry from the centrifuge, wherein the product slurry has a lower level of soluble polymeric silicates than does the polishing slurry.

In still another embodiment, the invention is use of a product slurry prepared according to the method given supra in a chemical mechanical polishing slurry instead of polishing slurry, wherein use of the product slurry affords a lower number of post polish defects than does use of the polishing slurry.

DETAILED DESCRIPTION OF THE INVENTION

The presence of soluble polymeric silicates have been found to be very undesirable components in colloidal silica-based polishing slurries that result in relatively high defectivity levels when the colloidal silica-based polishing slurries are used in CMP or other polishing applications. Substantial removal of these polymeric silicates from the colloidal silica-based slurries results in dramatic reductions in defectivity levels arising during CMP or other polishing with these slurries after removal of the polymeric silicates.

The soluble polymeric silicates present in colloidal silicas are crosslinked polysilicates with negative silicate anionic structures stabilized with positive counter ions (e.g., potassium ions). The amount of these materials is pH dependent. (See, for example, The Chemistry of Silica by R. K. Iler, John Wiley & Sons, New York, 1972, Page 42.). As the pH increases above 10, the amount of these materials also increases. The pH of colloidal silica is usually between 10.2 to 10.8 and over this range, the solubility of polysilicate is between approximately 0.2 to 1 weight %. The soluble silicates during an elevated temperature particle growth reaction in a colloidal silica reactor, or upon aging of the colloidal silica, can crosslink and form soft and hard gels, which can remain soluble for varying periods and not be filterable. Even after fine filtration (0.5 micron filters) of colloidal silica slurries, these soluble polymeric silicates/gels are present, and can settle appearing as viscoelastic materials. Upon aging, polysilicate gels in a ammonium-, sodium- or potassium-stabilized colloidal silica dispersion can also bridge with silica nanoparticles via cation ion bridging, and cause additional settling of particulates.

In this invention, centrifugation is used to remove soluble polymeric silicates from colloidal silica, and the resulting colloidal silica can be used in CMP or other polishing slurries as an abrasive that affords low defectivity levels in comparison to uncentrifuged colloidal silica (that contains higher levels of soluble polymeric silicates) while surprisingly resulting in a substantial increase in average colloidal particle size (for the colloidal silicas that were tested). In addition, the synergistic combination of centrifugation of a colloidal silica plus the addition of a surfactant to the colloidal silica affords even lower defectivity levels when the resulting colloidal silica is used in CMP or other polishing processing.

In a method embodiment of this invention for removal of soluble polymeric silicates, the centrifugation step can be effected with virtually any type of centrifuge. Suitable centrifuges include, but are not limited to, solid-bowl, sedimentation-type centrifuges. The size of the centrifuge can vary from that of a small lab-scale unit to a large industrial-scale unit. The centrifuge can be of type(s) such that operation of it is either continuous or batchwise (non-continuous). In one particular case, the operation of the centrifuge is continuous. Operation of the centrifuge can be done at G-values that range from about 500 (center of centrifuge) to about 8,000 (center of centrifuge) or higher; from about 2,000 (center of centrifuge) to about 7,000 (center of centrifuge); from about 4,000 (center of centrifuge) to about 6,000 (center of centrifuge); from about 4,500 (center of centrifuge) to about 5,500 (center of centrifuge); and at about 5,000 (center of centrifuge) to about 6,500 (edge of centrifuge).

In the aforementioned method embodiment, the method of introducing the polishing slurry into the centrifuge is not limited. Suitable methods include, but are not limited to, gravity feeding, pumping, and introduction with pressure of the polishing slurry into the centrifuge.

In another embodiment of the invention, filtration(s) is used in combination with centrifugation to effect removal of soluble polymeric silicates and certain other undesirable components (e.g., solid particulates). A first filtration step is done prior to step a), prior to step b), prior to step c), or after step c) of the aforementioned method. In a particular embodiment, the first filtration step is done prior to step a). In some cases, a second filtration step is desirable and is done after step c) of the aforementioned method.

In still another embodiment, the addition of a surfactant to the polishing slurry or product slurry is done in combination with centrifugation, which combination acts in a synergistic manner to afford even lower levels of defects than can be realized by either centrifugation or surfactant addition alone. In this embodiment, a step of adding a surfactant to the polishing slurry or product slurry is done prior to step a), prior to step b), prior to step c), or after step c) of the aforementioned method. In a particular embodiment, the step of adding a surfactant is done prior to step a).

A broad range of surfactants are useful in this embodiment involving addition of a surfactant. Suitable surfactants include, but are not limited to, nonionic surfactants. Suitable nonionic surfactants include, but are not limited to, Plurafac® S505LF, Surfynol® 465, and Triton® X-100.

Glossary

Å: angstrom(s)—a unit of length

CMP: chemical mechanical planarization=chemical mechanical polishing

L/min: liter(s) per minute min: minute(s)

ml: milliliter(s)

PETEOS: plasma enhanced deposition of tetraethoxy silane, dielectric oxide layer.

psi: pounds per square inch

IC1010: polishing pad used during chemical mechanical planarization, supplied by Rodel, Inc, Phoenix, Ariz.

Surfynol® 104E—This commercial product is 2,4,7,9-tetramethyl-5-decyn-4,7-diol in ethylene glycol in a 50:50 mixture, Air Products and Chemicals, Inc., Allentown, Pa.

(This 50:50 mixture is easy to handle during the preparation of CMP slurry formulations; hence, Surfynol® 104E was chosen over Surfynol® 104 for use in making the compositions used in the examples.)

Surfynol® 104—This commercial product is 2,4,7,9-tetramethyl-5-decyn-4,7-diol, Air Products and Chemicals, Inc., Allentown, Pa.

Surfynol® 465, and Surfynol® 420—Both Surfynol® 465, and Surfynol® 420 are ethoxylated acetylenic diol surfactants, difference is in the degree of ethoxylation, manufactured by Air Products and Chemical, Inc., Allentown, Pa.

Dimethylhexyldiol—This is a non-ionic acetylenic diol, supplied by Air Products and Chemical, Inc., Allentown, Pa.

Plurafac® S505LF—This is a linear polyoxyalkylene ether of C6–C10 alcohol, molecular weight is 1550 Daltons, manufactured by BASF, 3000 Continental Drive, North, Mount Olive, N.J., 07828

Plurafac® SL62—This is a linear polyoxyalkylene ether of C6–C10 alcohol, molecular weight is 840 Daltons, manufactured by BASF, 3000 Continental Drive, North, Mount Olive, N.J., 07828

SDS—Anionic sodium dodecyl sulfonate, manufactured by Sigma-Aldrich, P.O. Box 355, Milwaukee, Wis. 53201

Triton® X-100—This surfactant is non-ionic ethoxylated p-tert-Octylphenol, obtained from Sigma-Aldrich, P.O. Box 355, Milwaukee, Wis. 53201

Polyacrylic acid, anionic surfactant—This commercial product was obtained from Sigma-Aldrich, P.O. Box 355, Milwaukee, Wis. 53201

Renex-690—This surfactant is a non-ionic polyoxyethylene (10) nonylphenol, manufactured by ICI Americas, P.O. Box 15391, Wilmington, Del., 19850

Luviskol® VA64—This is a non ionic copolymer vinylpyrollidone/vinylacetate, manufactured by BASF, 3000, Continental Drive, North, Mount Olive, N.J., 07828

Colloidal silica—Syton® OX-K, supplied by DuPont Air Products NanoMaterials, L.L.C., Tempe, Ariz., 85282

Mazawet® DF—This is an ethoyxiated tertiary alcohol, manufactured by BASF, 3000 Continental Drive, North, Mount Olive, N.J., 07828

Zonyl® FSN—This surfactant is a non-ionic flouroethoxylated alcohol, manufactured by E.I. DuPont de Nemours, Inc., 1007 Market Street, Wilmington, Del., 19898

Post polish defects >0.13 $\mu$m (normalized)—Defects measured at >0.13 $\mu$m using a Surfscan 6420® relative to a control slurry, on PETEOS wafers post CMP processing.

Post HF dip defects >0.13 $\mu$m (normalized)—Defects measured at >0.13 $\mu$m using a Surfscan 6420® relative to a control slurry, on PETEOS wafers post CMP processing and following the HF Dip Test.

Oversize particles/ml >1 $\mu$m—Number of particles per ml having diameters greater than 1.0 micron measured with a Particle Sizing Systems AccuSizer 780A instrument.

Oversize particles/ml >1 $\mu$m (normalized)—Number of particles per ml having diameters greater than 1.0 micron measured with a Particle Sizing Systems AccuSizer 780A instrument, relative to a control slurry.

EXAMPLES

In the examples presented below, chemical mechanical planarization (CMP) experiments were run using the procedures and experimental conditions as given below.

Metrology

PETEOS thickness was measured with a Nanometrics instrument, model NanoSpec® 9200, Advanced Film Analysis System, manufactured by Nanometrics Inc, 1550 Buckeye Drive, Milpitas, Calif. 95035. Twenty-five and forty nine-point polar scans were taken at 5-mm edge exclusion. From the polar scan data, PETEOS thickness was calculated using the difference between the average starting PETEOS thickness and average post-polish PETEOS thickness.

Polisher

The CMP tool used for polishing experiments was a Mirra® CMP System, manufactured by Applied Materials, 3050 Bowers Avenue, P.O. Box 58039, Santa Clara, Calif., 95054. A Rodel® IC1010 pad was used on platen 1, and a Politex® pad was used on platen 3. Both pads were supplied by Rohm and Haas Electronic Materials, 3804 East Watkins Street, Phoenix, Ariz., 85034. The latter pad was used on the platen for the blanket wafer polishing studies. Pads were broken-in by polishing ten-to-fifteen dummy oxide (deposited by plasma enhanced CVD from a TEOS precursor, PETEOS) wafers. In order to qualify the tool settings and the pad break-in, two PETEOS monitors were polished with Syton® OX-K colloidal silica, supplied by DuPont Air Products NanoMaterials L.L.C., at baseline conditions. The pad conditioner was a Saesol pad conditioning disk, diamond—4 inches with 80 grit at 6 pounds of down-force, supplied by Vias International, 8200 Cameron Road, Suite 162, Austin, Tex., 78754. The oxide polishing conditions using the Mirra® tool were as follows:

Platen speed=93 RPM
Head speed=87 RPM
Inner tube pressure=5.0 psi
Retaining ring pressure=7.2 psi
Membrane pressure=5.0 psi
Slurry flow rate=175 ml/min
Polish time=60 seconds
Conditioning disk down-force/rotation=6 lbs/95 rpm
Heads—standard Titan®
Retaining rings—AEP grooved
Conditioning Disk—Saesol Wafers Polishing experiments were conducted using PETEOS (plasma enhanced tetraethoxysilane) 200 mm wafers. These blanket wafers were purchased from Advantiv Technologies (TM), Inc., 111 N. Market St., Suite 600 San Jose, Calif. 95113. The PETEOS film thickness specification for these wafers is 15,000 Å.

Defect Measurements

All defects were measured using a Surfscan 6420®, supplied by KLA Tencor Corporation, Mountain View, Calif. The Surfscan 6420® detects, counts, and sizes light point defects on the oxide substrate using laser beam scanning for defect detection.

Description/Use of Centrifuge

All centrifugations (except for Examples 33–34) of colloidal silica samples (slurries) described herein were made using an Alfa-Laval WSB-103B-74 disk-stack centrifuge (Alfa-Laval, Inc., Richmond, Va.). This centrifuge has a bowl volume of 1.2 liters. The separation of gels (including soluble polymeric silicates) from a given slurry prior to centrifugation occurred between the thin disks of the centrifuge at a G-value of 5000–6500 (center to edge), and the gels collected and built up on the side of the centrifuge bowl. The centrifuge bowl was cleaned periodically after 5 gallons of Syton® OX-K colloidal silica had passed through. Unless otherwise noted, the slurry was pumped into the centrifuge at a rate of 0.5 L/min, which rate corresponds to a residence time of 2.4 minutes. The flow rates tested in these examples ranged from 0.4 to 8 liters/minute.

Particle Sizing Determinations

All particle size and number measurements were made using a Particle Sizing Systems (PSS) AccuSizer 780A instrument (PSS, Santa Barbara, Calif.). With use of an optical sensor, this instrument measures diameters of individual particles (assumed to be spherical in shape) and then counts the number of particles within a given sample size having diameters greater than 1.0 micron. A given sample is automatically diluted until the sensor "sees" one particle at a time within the sample.

HF Dip Test

Following CMP processing and a subsequent DI water cleaning, the CMP-processed PETEOS wafers were dipped in 1% aqueous hydrofluoric acid solution for 210 seconds. During the HF dip experiment, 1% aqueous hydrofluoric acid dissolves the silica contamination, thus highlighting and exposing defects as tiny micro-scratches on the wafers. The wafers were then rinsed with DI water and measured for defectivity. After rinsing wafers with DI water, defects were measured using the Surfscan 6420®. The Surfscan 6420® detects, counts, and sizes light point defects on the oxide substrate using laser beam scanning for defect detection. (Additional details concerning the HF dip test are given in a paper entitled "quantified Defect Performance of Oxide Chemical Mechanical Planarization (CMP) Slurries" by G. Bonne et al., Mar. 7–8, 2001 CMP-MIC Conference, Santa Clara, Calif., pages 543–6.)

Examples 1–5

These examples illustrate the effect of centrifugation and surfactant use according to the invention on polishing performance with use of the colloidal silica-based slurries in these examples. More specifically, slurries of these examples were characterized for the number of oversize particles that they contain, and wafers subjected to CMP-processing with these slurries were characterized for the number of defects found subsequent to CMP processing.

Example 1 (Comparative)

In this comparative example, a commercially-available colloidal silica (Syton® OX-K, DuPont Air Products Nano-Materials, L.L.C., Tempe, Ariz.) was used alone as the polishing slurry. This colloidal silica is a 30 weight percent dispersion in water and has a particle size of 50–60 nanometers as measured by Capillary Hydro-Dynamic Flow using a model number CHDF 2000 (Matec Applied Sciences.)

This colloidal silica was used "as is" for CMP processing in this example without centrifugation of the colloidal silica and without surfactant addition to the colloidal silica.

Example 2

In this example, a commercially available colloidal silica (Syton® OX-K, DuPont Air Products NanoMaterials, L.L.C., Tempe, Ariz.) was subjected to centrifugation prior to its use in CMP processing. The centrifugation was done at a G-value of 5000–6500, which conditions were selected after optimizing centrifuge process conditions. During the centrifugation of the colloidal silica, soluble gels present in the colloidal silica were found to collect and build up on the side of the centrifuge bowl and hence were separated from the effluent (product) of centrifuged colloidal silica. The colloidal silica was pumped into the centrifuge at a rate of 0.5 L/min, which corresponds to a residence time of 2.4 min. The resulting centrifuged colloidal silica subsequently was used as slurry for CMP processing without addition of any surfactant.

Example 3

In this example, a surfactant (Plurafac® S505LF, BASF Corp., Mount Olive, N.J.), was added at a 75 ppm level to commercially-available colloidal silica (Syton® OX-K, DuPont Air Products NanoMaterials, L.L.C., Tempe, Ariz.). More specifically, this colloidal silica (499.63 grams as 30% solids) and this surfactant (0.38 gram) were mixed together to afford the surfactant-containing colloidal silica. The resulting surfactant-containing colloidal silica subsequently was used as slurry for CMP processing without there having been any centrifugation treatment.

Example 4

In this example, a commercially available colloidal silica (Syton® OX-K, DuPont Air Products NanoMaterials, L.L.C., Tempe, Ariz.) was first subjected to centrifugation and then a surfactant (Plurafac® S505LF) was added to the resulting centrifuged product. The centrifugation conditions were the same as in Example 2. The surfactant-containing colloidal silica of this example was prepared by mixing 499.63 grams of centrifuged colloidal silica with 0.38 gram of 10 weight percent of Plurafac® S505LF surfactant. The resulting centrifuged, surfactant-containing colloidal silica subsequently was used as slurry for CMP processing.

Example 5

The example 5 was a repeat of Example 4 except that the only difference was that Plurafac® S505LF was added to the colloidal silica before centrifugation.

Discussion of Examples 1–5

Figure 1:
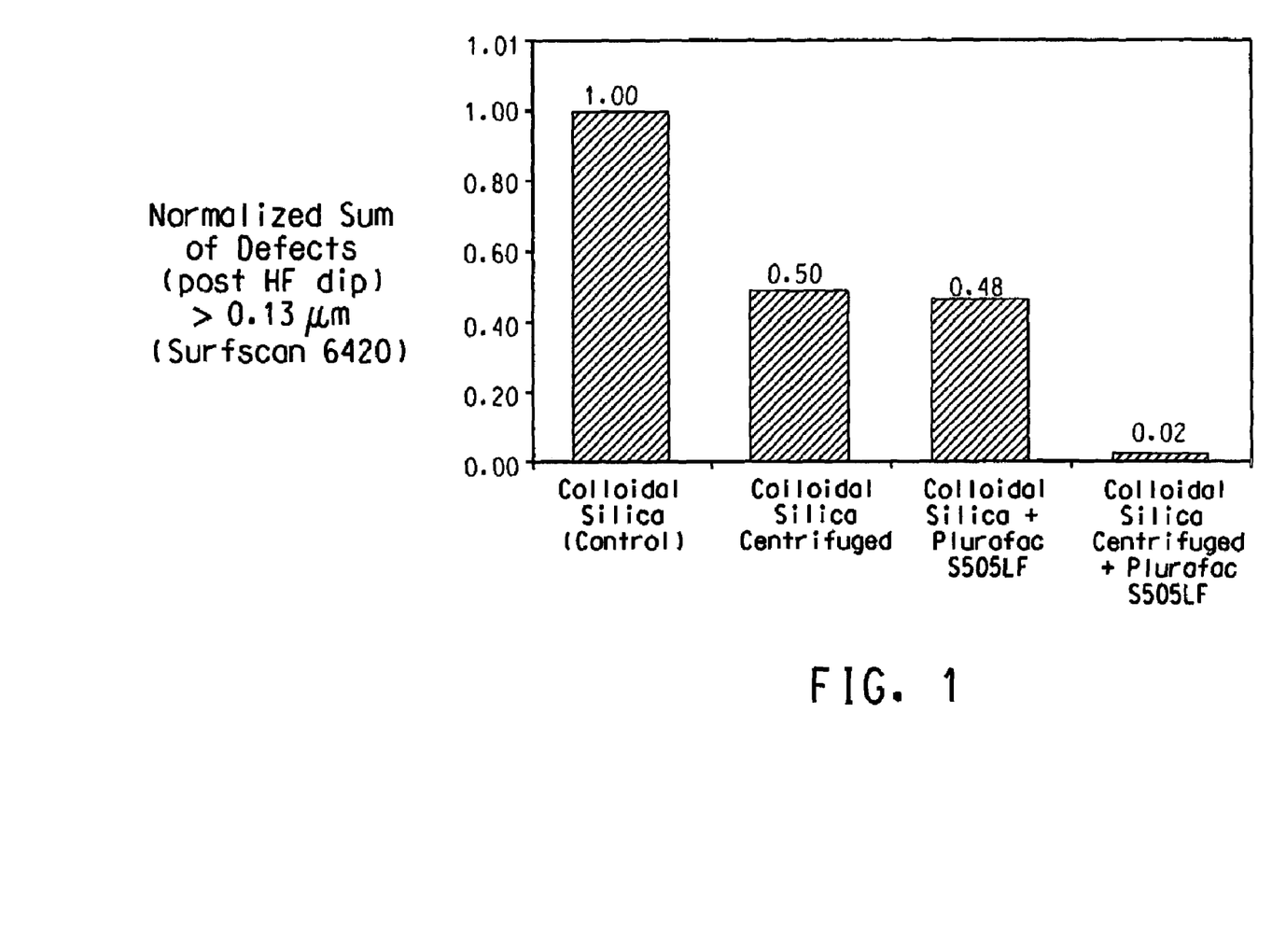
FIG. 1 gives a comparison of the numbers of post-HF dip defects measured on PETEOS wafers after chemical mechanical planarization with use of various colloidal silica-based slurries.

Key results for Examples 1–5 are summarized in Table 1, which include defectivity data for wafers processed using the five slurries and measurements of the number of oversize particles in these slurries. As this table indicates, there is a dramatic reduction in the number of defects found on wafers subjected to CMP processing using the centrifuged, surfactant-containing slurry of Examples 4 and 5. Furthermore, centrifugation alone or surfactant-addition alone also afforded reductions in the number of defects in comparison to use of the colloidal silica of Example 1 (comparative) that was not centrifuged nor had there been addition of a surfactant. Interestingly, addition of Plurafac® S505LF either before centrifugation or after centrifugation has a similar impact on the performance of the slurry from the standpoint of defectivity. Key results for Examples 1–4 are also summarized in FIG. 1, which include defectivity data for wafers processed using the slurries.

Figure 2:
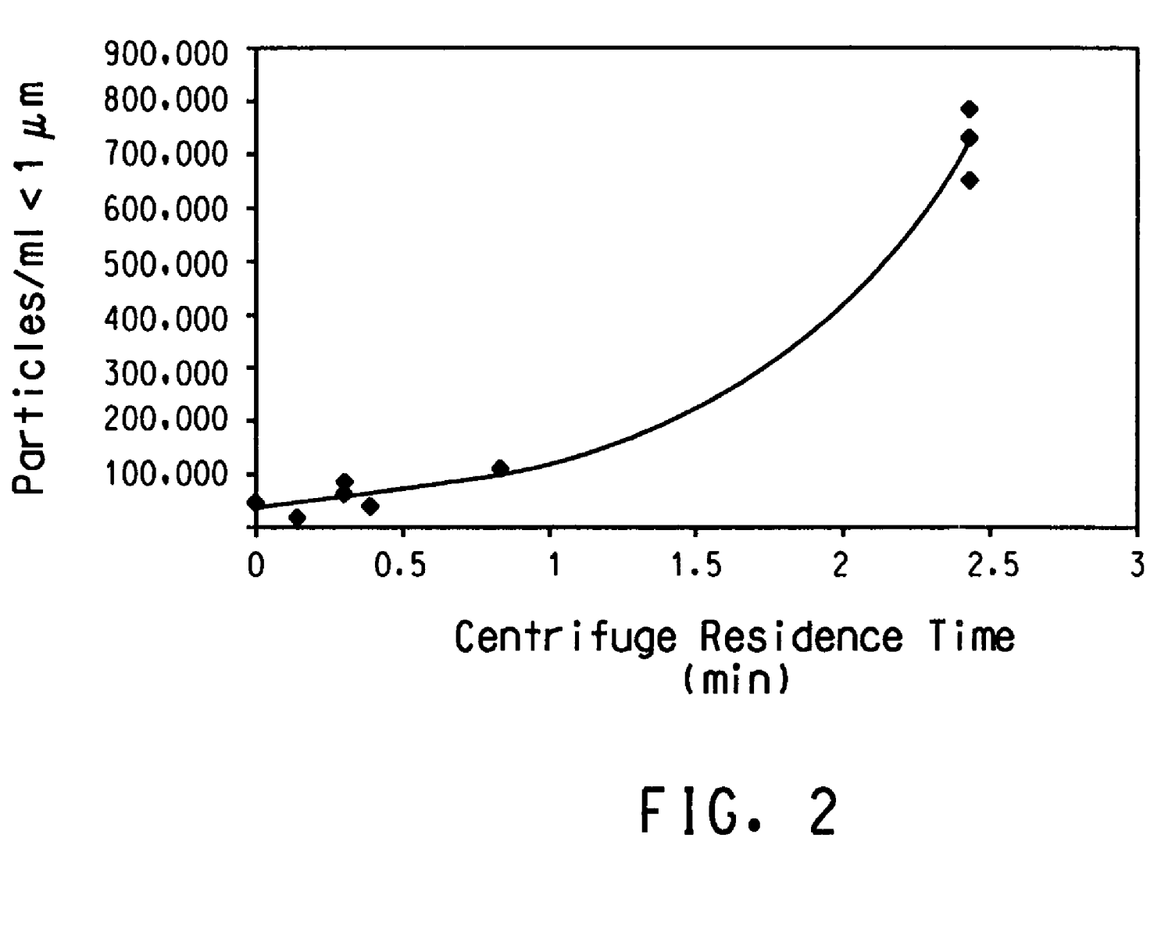
FIG. 2 illustrates the effect of centrifuge residence time on the numbers of oversize particles generated that are greater than one micron.

As shown in FIG. 2 and Table 1, the number of oversize particles having diameters greater than 1 micron increased upon centrifugation. Most surprisingly, even though the number of particles increased in the colloidal silica samples from measured values of approximately 50,000/ml particles prior to centrifugation and without surfactant addition to greater than 350,000/ml following centrifugation at a residence time of 2.4 min and surfactant addition, the number of defects measured on wafers processed with this centrifuged colloidal silica was markedly reduced. This results indicates that defectivity introduced during oxide CMP is not correlated with nor related to the number of oversize particles but rather relates to the level of soluble polymeric silicates that are present in colloidal silica and which can be removed by centrifugation and/or converted to a less detrimental form by surfactant addition.

Examples 6–17, Table 2

These examples illustrate the effect of adding various nonionic and anionic surfactants upon defectivity levels following oxide CMP. In each of these examples, the commercially-available colloidal silica used was Syton® OX-K (DuPont Air Products NanoMaterials, L.L.C., Tempe, Ariz.).

The following twelve slurry formulations were evaluated:

Example 6: colloidal silica dispersion, control with no surfactant, and no filtration.

Example 7: colloidal silica dispersion, control with no surfactant, filtered through 1-micron filter.

Example 8 through 17: In all, 10 samples of colloidal silica (uncentrifuged) dispersions were prepared using different classes of nonionic and anionic surfactants. These surfactant-formulated slurries were prepared by mixing 30% colloidal silica slurry with 75 PPM of the surfactant.

The resulting colloidal silica dispersions of Examples 6 though 17 subsequently were used as slurries for CMP processing. In Table 2, defectivity data measured on wafers subjected to CMP for the various formulations from Examples 6 through 17 is summarized. Clearly, compared to the control colloidal silica dispersion, filtration of the colloidal silica slurry through 1-micron improved post-HF dip defects from 1.0 to 0.9 (normalized values). All nonionic surfactants reduced defectivity from the normalized value of 1.0 for the control to as low as 0.48. The best results, lowest post-HF defectivity, were obtained using Triton® X-100, and Plurafac® SS505LS. Compared to nonionic surfactants, anionic surfactant such as polyacrylic acid performed the worst from the standpoint of post-HF defectivity.

Examples 18–26, Table 3

These examples illustrate the effect of adding various nonionic and anionic surfactants to the centrifuged colloidal silica slurry upon defectivity levels measured following oxide CMP. In each of these examples, the commercially-available colloidal silica used was Syton® OX-K (DuPont Air Products NanoMaterials, L.L.C., Tempe, Ariz.).

The following 9 colloidal silica slurries were prepared and subsequently evaluated as slurries for CMP processing.

Example 18: control colloidal silica dispersion, Syton® OX-K, 30% dispersion, data such as post-polish defects greater than 0.13 micron, post-HF defects greater than 0.13 micron, and particles above 1 micron are tabulated, and normalized to a value of 1.0.

Examples 19 through 26: centrifuged Syton® OX-K, colloidal silica samples, 30% solids, were prepared using the procedure as described in Example 2, followed by the addition of 75 PPM of various non-ionic surfactants to the centrifuged samples before starting CMP experiments. After CMP experiments, data such as post polish defects greater than 0.13 micron, post-HF defects above 0.13 micron, and oversize particles above 1.0 micron were measured. All data collected was normalized with respect to the control experiment, as described in Example 18.

The results from Examples 18 through 26 are summarized in Table 3. Clearly, compared to the control sample, Example 18, all surfactant containing centrifuged colloidal silica samples in Examples 19 through 25 evaluated for CMP gave very low defect counts post CMP. The best post HF dip defects results were obtained using a combination of centrifuged colloidal silica with either Triton® X-100 or Plurafac® S505LF. Compared to the control sample, the defect count dropped from a normalized value of 1.0 to 0.02. Interestingly, all centrifuged and surfactant containing samples in these examples had increased count of oversized particles above 1 micron, suggesting the origin of low defects measured on the wafer post CMP results from the removal of polymeric soluble silicates from the colloidal silica dispersion.

Examples 27–32, Table 4

These examples illustrate the effect of varying the surfactant (Plurafac® S505LF) concentration in centrifuged colloidal silica slurries upon defects measured on PETEOS wafers following oxide CMP. In each of these examples, the starting commercially-available colloidal silica was Syton® OX-K (DuPont Air Products NanoMaterials, L.L.C., Tempe, Ariz.) and the centrifuged colloidal silica was obtained as described in Example 2 using the Alfa-Laval centrifuge.

The following six slurry formulations were evaluated:

Example 27: Control colloidal silica dispersion, Syton® OX-K, 30% solids, data such as post-polish defects greater than 0.13 micron, post-HF defects greater than 0.13 micron, and particles above 1 micron are tabulated, and normalized to a value of 1.0.

Examples 28 through 32: The centrifuged colloidal silica samples were doped with five different concentrations of Plurafac® S505 LF; these concentrations were 20 PPM, 50 PPM, 100 PPM, 200 PPM, and 400 PPM, respectively. For each variant, data such as post-polish defects greater than 0.13 micron, post-HF defects greater than 0.13 micron, and particles above 1 micron, are tabulated.

The results from Examples 27 through 32 are summarized in Table 4. Clearly, compared to the control sample, Example 27, addition of different amounts of the surfactant Plurafac® S505LF in Examples 28 through 32 evaluated for CMP dramatically reduced post-polish defects greater than 0.13 micron, and post-HF defects greater than 0.13 micron. As the concentration of surfactant increased from 20 PPM to 400 PPM in the centrifuged colloidal silica samples, the number of oversize particles above 1 micron increased three-fold. However, an increase in the surfactant concentration reduced the normalized post-polish defects greater than 0.13 micron from 1.0 to 0.06. Furthermore, the post-HF defects greater than 0.13 micron appear to have minimal variation in the range of 20 to 400 PPM of Plurafac® S505L.

Examples 33–34, Table 5

These examples illustrate the invention using a larger centrifuge and a different colloidal silica (DuPont Air Products NanoMaterials, L.L.C., Tempe, Ariz.), which is a 30 weight percent potassium-stabilized dispersion in water with a particle size of 50–60 nanometers as measured by Capillary Hydro-Dynamic Flow using a model number CHDF 2000 (Matec Applied Sciences.). The larger machine was a Westfalia SA20, disk-stack type centrifuge, manufactured by Westfalia, Werner-Habig Street 1, 59302 Oelde, Germany. The Westfalia SA20 is a nozzle type centrifuge that is operated in a continuous mode with periodic de-sludge operations, where the nozzles are rinsed with water to remove buildup of gel. The colloidal silica used in Examples 33 and 34 has a narrower particle size distribution compared to the commercially available Syton® OX-K (DuPont Air Products NanoMaterials, L.L.C., Tempe, Ariz.). A slurry was made having the following composition:

1) Colloidal silica=6400 kilograms
2) Plurafac® S505 LF=450 g (70 PPM)

This slurry was centrifuged using the following process conditions:

a) Slurry flow rate=2700–3000 liters per hour.
b) De-sludge frequency=3 to 4 minutes.
c) G-forces=5950–9327 (from center to edge)

The resulting surfactant-containing centrifuged slurry was used for polishing PETEOS wafers under polishing conditions exactly as described in previous examples. For comparison purposes, the colloidal silica was also evaluated for CMP (see Example 34) with no surfactant being added, and no centrifugation. The data for Examples 33 and 34 (control) are shown in Table 5. Clearly, the data in Table 5 indicates that even though the normalized oversize particle count above 1 micron increased after centrifugation and surfactant addition, the post polish defects as well as post HF dip defects above 0.13 micron were reduced dramatically with surfactant-addition and centrifugation (Example 33) compared to the control (Example 34).

Example 35

This example illustrates the relationship between slurry residence time in the centrifuge as a function of oversize particle formation above 1.0 micron.

In this example an Alfa-Laval WSB-103B-74 disc-stack centrifuge (Alfa-Laval, Inc, Richmond) was used for centrifugation experiments. The slurry was pumped into the centrifuge in this example at values ranging from 0.4 L/min to 8 L/min, where the rate slurry was pumped into the centrifuge determines the residence time in the centrifuge. For example, a rate of 0.4 L/min corresponds to a residence time of 2.4 minutes whereas a rate of 8 L/min corresponds to a residence time of 0.4 minutes. The centrifugation was done at a G-value of 5000–6500 using Syton® OX-K, DuPont Air Products NanoMaterials L.L.C, Tempe, Ariz.). The centrifuged samples were collected at different residence times, hence different slurry feed rates, and the particle size above 1.0 micron was measured using a Particle Sizing Systems AccuSizer 780A instrument for samples centrifuged at different residence times.

FIG. 2 plots the number of particles above 1.0 micron as a function of sample residence time in the centrifuge. As shown in FIG. 2, the number of oversize particles having diameters greater than 1 micron increased upon centrifugation (and with increasing centrifuge residence time). As the residence time increased from 0.3 minutes to 2.4 minutes, the number of particles above 1.0 micron increased from less than 100,000 particles above 1.0 micron to approximately 800,000 particles above 1.0 micron. During centrifugation experiments, three repeat trials were conducted at the flow rate of 0.4 liters per minute; the three repeats show that this increase in particle size at 1.0 micron is reproducible within the statistical variation of the particle size measurement instrument. Most surprisingly, for Examples 1–5 (Table 1) even though the number of particles increased in the colloidal silica samples from measured values of approximately 50,000/ml particles prior to centrifugation and without surfactant addition to greater than 350,000/ml following centrifugation at a residence time of 2.4 min and surfactant addition, the number of defects measured on wafers processed with this centrifuged colloidal silica was markedly reduced. The results from Examples 1–5 also indicates that defectivity introduced during oxide CMP is not correlated with nor related to the number of oversize particles but rather relates to the level of soluble polymeric silicates that are present in the colloidal silica and which can be removed by centrifugation and/or converted to a less detrimental form by surfactant addition.

TABLE 1

Chemical Mechanical Planarization of PETEOS wafers - Effect of Centrifugation, Surfactant (Plurafac ® S505LF), and Combination of Centrifugation and Surfactant on Defectivity, Abrasive solids 30%

| Slurry## | Post polish defects > 0.13 μm (normalized) | Post HF dip defects > 0.13 μm (normalized) | Oversize particles/ ml > 1 μm |
|---|---|---|---|
| Example 1: Colloidal Silica (Control) | 1.00 | 1.00 | 50,354 |
| Example 2: Colloidal Silica centrifuged | 0.14 | 0.50 | 350,561 |
| Example 3: Colloidal Silica + Plurafac ® S505LF, (uncentrifuged) | 0.90 | 0.48 | 62,542 |
| Example 4: Colloidal Silica centrifuged + Plurafac ® S505LF | 0.07 | 0.017 | 384,556 |
| Example 5: Same as Example 4, except Plurafac S505 LF added before Centrifugation | 0.07 | 0.016 | not measured |

Plurafac ® S505LF = Non-ionic linear alkoxylated alcohol, supplied by BASF Corporation, 3000 Continental Drive North, Mount Olive, NJ 07828
Examples 4 and 5 were run using the same lot of Syton ® OX-K

TABLE 2

Chemical Mechanical Planarization of PETEOS wafers - Effect of Adding Various Nonionic and Anionic Surfactants on Defectivity, Abrasive solids, 30%

| Slurry Colloidal Silica## + various surfactants | Post polish defects > 0.13 μm (normalized) | Post HF dip defects > 0.13 μm (normalized) |
|---|---|---|
| Example 6: Control (no surfactant) | 1.00 | 1.00 |
| Example 7: Colloidal Silica filtered (no surfactant) | 0.65 | 0.90 |
| Example 8: Colloidal silica + Plurafac ® SS05LF | 0.90 | 0.48 |
| Example 9: Colloidal silica + Surfynol ® 465 | 0.90 | 0.53 |
| Example 10: Colloidal silica + Surfynol ® 104 | 1.06 | 0.86 |
| Example 11: Colloidal silica + Plurafac ® SL62 | 0.92 | 0.50 |
| Example 12: Colloidal silica + Dimethylhexyldiol. | 1.04 | 0.81 |
| Example 13: Colloidal silica + SDS | 1.14 | 0.67 |
| Example 14: Colloidal silica + Triton ® X-100 | 0.93 | 0.50 |
| Example 15: Colloidal silica + Polyacrylic acid | 1.39 | 1.07 |
| Example 16: Colloidal silica + Renex-690 | 1.02 | 0.53 |
| Example 17: Colloidal silica + Luviskol ® VA64 | 0.87 | 0.53 |

Plurafac ® SS05LF = Non-ionic linear alkoxylated alcohol
Surfynol ® 465 = Non-ionic ethoxylated Acetylenic Diol
Surfynol ® 104 = Non-ionic Acetylenic Diol
Plurafac ® SL62 = Non-ionic linear alkoxylated alcohol
Dimethylhexyldiol. = Non-ionic Acetylenic diol
SDS = Anionic sodium dodecy sulfonate
Triton ® X-100 = Non-ionic ethoxylated p-tert-Octylphenol
Polyacrylic acid = Anionic surfactant
Renex-690 = Non-ionic Polyoxyethylene (10) nonylphenol
Luviskol ® VA64 = Non-ionic Vinylpyrollidone/vinylacetate co-polymer
Colloidal silica used was Syton ® OX-K, Supplied by DuPont Air Products NanoMaterials, L.L.C., Tempe, AZ

TABLE 3

Chemical Mechanical Planarization of PETEOS wafers - Effect of Adding various Surfactants to the Centrifuged Colloidal Silica and their Role on Defectivity, Abrasive solids, 30%

| Slurry Colloidal Silica## Centrifuged + various surfactants | Post polish defects > 0.13 μm (normalized) | Post HF dip defects > 0.13 μm (normalized) | Oversize particles/ ml > 1 μm (normalized) |
|---|---|---|---|
| Example 18: Control (no surfactant) | 1.00 | 1.00 | 1.00 |
| Example 19: Colloidal silica + Plurafac ® S505LF | 0.22 | 0.04 | 1.22 |
| Example 20: Colloidal silica + Surfynol ® 465 | 0.34 | 0.21 | 1.42 |
| Example 21: Colloidal silica + Surfynol ® 465 (repeat) | 0.24 | 0.17 | 1.16 |
| Example 22: Colloidal silica + Triton ® X-100 | 0.24 | 0.05 | 1.40 |
| Example 23: Colloidal silica + Triton ® X-100 (repeat) | 0.19 | 0.04 | 1.28 |
| Example 24: Colloidal silica + Surfynol ® 420 | 0.48 | 0.85 | 1.55 |
| Example 25: Colloidal silica + Mazawet ® DF | 0.28 | 0.21 | 1.74 |
| Example 26: Colloidal silica + Zonyl ® FSN | 0.28 | 0.10 | 2.13 |

Plurafac ® S505LF = Non-ionic ethoxlated linear alcohol
Surfynol ® 465 = Non-ionic ethoxylated acetylenic diol
Triton ® X-100 = Non-ionic ethoxylated p-tert-Octylphenol
Surfynol ® 420 = Non-ionic ethoxlated acetylenic diol
Mazawet ® DF = Non-ionic ethoxlated tertiary alcohol
Zonyl ® FSN = Non-ionic flouroethoxylated alcohol
Colloidal silica used was Syton ® OX-K, Supplied by DuPont Air Products NanoMaterials, L.L.C., Tempe, AZ

TABLE 4

Chemical Mechanical Planarization of PETEOS wafers - Effect of Surfactant Concentration on Defectivity, Abrasive solids, 30%

| Slurry Colloidal Silica## + sufactant level | Post polish defects > 0.13 μm (normalized) | Post HF dip defects > 0.13 μm (normalized) | Oversize particles/ ml > 1 μm (normalized) |
|---|---|---|---|
| Example 27: Uncentrifuged colloidal silica + no surfactant (Control) | 1.00 | 1.00 | 1.00 |
| Example 28: Centrifuged colloidal silica + 20 ppm Plurafac ® S505LF | 0.12 | 0.034 | 2.19 |
| Example 29: Centrifuged colloidal silica + 50 ppm Plurafac ® S505LF | 0.16 | 0.024 | 2.18 |
| Example 30: Centrifuged colloidal silica + 100 ppm Plurafac ® S505LF | 0.12 | 0.030 | 2.69 |
| Example 31: Centrifuged colloidal silica + 200 ppm Plurafac ® S505LF | 0.13 | 0.027 | 2.93 |
| Example 32: Centrifuged colloidal silica + 400 ppm Plurafac ® S505LF | 0.06 | 0.022 | 3.18 |

Colloidal silica used was Syton ® OX-K, Supplied by DuPont Air Products NanoMaterials, L.L.C., Tempe, AZ

TABLE 5

Chemical Mechanical Planarization of PETEOS Wafers - Data Collected Using Westfalia SA20 Centrifuge and Colloidal Silica

| Slurry samples | Post-polish defects > 0.13 μm (normalized) | Post-HF dip defects > 0.13 μm (normalized) | Oversize particles/ ml > 1 μm (normalized) |
|---|---|---|---|
| Example 33: Colloidal silica, Plurafac ® S505 LF (70 PPM), and centrifuged using Westfalia SA20 | 0.03 | 0.008 | 4.4 |
| Comparative Example 34: Colloidal silica, (uncentrifuged), No surfactant | 1.00 | 1.00 | 1.0 |

What is claimed is:

1. A method for separating and removing soluble polymeric silicates in a polishing slurry, said slurry comprising a colloidal dispersion of silica, prior to a chemical mechanical polishing process, the method comprising:
    a) introducing the polishing slurry into a centrifuge;
    b) separating via centrifugation the soluble polymeric silicates, as a portion, from the polishing slurry to yield a product slurry; and
    c) removing the product slurry from the centrifuge, wherein the product slurry has a lower level of soluble polymeric silicates than does the polishing slurry.

2. The method of claim 1 wherein the centrifuge is a solid bowl, sedimentation-type centrifuge comprising a vertical stack of thin discs, the soluble polymeric silicates are ejected through a plurality of nozzles on the centrifuge, and the product slurry is continuously removed from the centrifuge.

3. The method of claim 1 further comprising a first filtration step done prior to step a), prior to step b), prior to step c), or after step c).

4. The method of claim 3 wherein the first filtration step is done prior to step a).

5. The method of claim 1 further comprising a step of adding a surfactant to the polishing slurry or product slurry prior to step a), prior to step b), prior to step c), or after step c).

6. The method of claim 5 wherein the surfactant is added to the polishing slurry prior to step a).

7. The method of claim 6 wherein the surfactant is a nonionic surfactant.

8. The method of claim 7 wherein the surfactant is selected from the group consisting of a linear polyoxyalkylene ether of a $C_6$–$C_{10}$ alcohol, an ethoxylated acetylinic diol, and an ethoxylated p-tert-octyl phenol.

9. The method of claim 1 wherein the product slurry has a larger number of oversize particles having diameters above 1.0 micron than does the polishing slurry as measured by instrumental analysis with an instrument equipped with an optical sensor that measures individual particle sizes.

10. The method of claim 1 further comprising a second filtration step done after step c).

11. A product slurry prepared according to the method of claim 1 starting with a polishing slurry, wherein the product slurry is characterized to have a lower level of soluble polymeric silicates than does the polishing slurry.

12. A product slurry prepared according to the method of claim 1 starting with a polishing slurry, wherein the product slurry is characterized to have a higher level of oversize particles having diameters above 1.0 micron than does the polishing slurry as measured by instrumental analysis with an instrument equipped with an optical sensor that measures individual particle sizes.

13. Use of a product slurry prepared according to the method of claim 1 in a chemical mechanical polishing slurry instead of polishing slurry, wherein use of the product slurry affords a lower number of post polish defects than does use of the polishing slurry.

* * * * *